US012567526B2

(12) United States Patent
Shaffer

(10) Patent No.: US 12,567,526 B2
(45) Date of Patent: Mar. 3, 2026

(54) SOLENOID ASSEMBLY WITH INCLUDED CONSTANT-CURRENT CONTROLLER CIRCUIT

(71) Applicant: Hanchett Entry Systems, Inc., Phoenix, AZ (US)

(72) Inventor: Randall Shaffer, Phoenix, AZ (US)

(73) Assignee: Hanchett Entry Systems, Inc., Phoenix, AZ (US)

( * ) Notice: Subject to any disclaimer, the term of this patent is extended or adjusted under 35 U.S.C. 154(b) by 447 days.

(21) Appl. No.: 18/145,934

(22) Filed: Dec. 23, 2022

(65) Prior Publication Data

US 2023/0126500 A1 Apr. 27, 2023

Related U.S. Application Data

(60) Continuation-in-part of application No. 17/078,135, filed on Oct. 23, 2020, now Pat. No. 11,545,289, (Continued)

(51) Int. Cl.
*H01F 41/02* (2006.01)
*H01F 7/06* (2006.01)
(Continued)

(52) U.S. Cl.
CPC ........... *H01F 7/064* (2013.01); *H01F 7/1838* (2013.01); *H01F 41/02* (2013.01); *H05K 1/18* (2013.01);
(Continued)

(58) Field of Classification Search
CPC ........ H01F 7/064; H01F 7/1838; H01F 41/02; H05K 1/18; H05K 7/1427
(Continued)

(56) References Cited

U.S. PATENT DOCUMENTS

| | | | |
|---|---|---|---|
| 3,663,949 A | 5/1972 | Froeschle | |
| 3,894,417 A | 7/1975 | Taniyama | |

(Continued)

FOREIGN PATENT DOCUMENTS

| | | | | |
|---|---|---|---|---|
| CA | 2789888 | 3/2013 | | |
| CN | 102892967 A | * 1/2013 | .............. | E05F 15/73 |

(Continued)

OTHER PUBLICATIONS

Don Wilcher, "Learn Electronics with Ardurino," Jul. 2012, p. 74-75, Apress, 1st ed.

(Continued)

*Primary Examiner* — Rexford N Barnie
*Assistant Examiner* — Swarna N Chowdhuri
(74) *Attorney, Agent, or Firm* — Woods Oviatt Gilman LLP; Dennis B. Danella, Esq.

(57) ABSTRACT

A constant-current control circuit comprising a switching circuit including a source voltage, and primary and secondary switches is provided. The primary GaNFET switch is connected with a solenoid assembly coil. The secondary switch is connected with the coil which has an inductance. From $t_0$ to $t_{on}$, the primary GaNFET switch is closed and the secondary switch is open, the source voltage is applied across the coil, and a counter EMF decays until the voltage across the coil equals the source voltage at $t_{on}$, thereby allowing current to flow through the coil. From $t_{on}$ to T, the primary GaNFET switch is open and the secondary switch is closed, and a positive EMF equal to the source voltage is applied across the coil until the positive EMF decays to zero at T, such that the current continues to flow through the coil without the source voltage being applied across the coil.

14 Claims, 7 Drawing Sheets

Related U.S. Application Data which is a division of application No. 16/406,464, filed on May 8, 2019, now Pat. No. 10,964,467, which is a continuation-in-part of application No. 15/098,522, filed on Apr. 14, 2016, now Pat. No. 10,378,242.

(60) Provisional application No. 62/147,478, filed on Apr. 14, 2015.

(51) Int. Cl.

| | |
|---|---|
| *H01F 7/18* | (2006.01) |
| *H05K 1/02* | (2006.01) |
| *H05K 1/18* | (2006.01) |
| *H05K 7/14* | (2006.01) |

(52) U.S. Cl.
CPC . *H05K 7/1427* (2013.01); *H05K 2201/09018* (2013.01)

(58) Field of Classification Search
USPC ......................................................... 307/115
See application file for complete search history.

(56) References Cited

U.S. PATENT DOCUMENTS

| | | | |
|---|---|---|---|
| 4,102,526 | A | 7/1978 | Hargraves |
| 4,536,728 | A | 8/1985 | Cyrot |
| 4,542,440 | A | 9/1985 | Chetty et al. |
| 4,841,207 | A | 6/1989 | Cheyne |
| 4,872,100 | A | 10/1989 | Diaz |
| 5,100,184 | A | 3/1992 | Schmitt |
| 5,343,759 | A | 9/1994 | Hesthamar et al. |
| 5,432,693 | A | 7/1995 | Anderson |
| 5,673,166 | A | 9/1997 | Hoffman |
| 5,933,067 | A | 8/1999 | Frolov |
| 6,352,317 | B1 | 3/2002 | Blazic et al. |
| 6,356,043 | B2 | 3/2002 | Baum |
| 6,384,711 | B1 | 5/2002 | Cregger et al. |
| 6,934,140 | B1 | 8/2005 | Rober et al. |
| 7,046,111 | B2 | 5/2006 | Sigl |
| 7,106,593 | B2 | 9/2006 | Stabile et al. |
| 7,158,361 | B2 | 1/2007 | Horn |
| 7,212,173 | B2 | 5/2007 | Chen et al. |
| 7,430,102 | B2 | 9/2008 | Groh et al. |
| 7,433,171 | B2 | 10/2008 | Vincent et al. |
| 7,813,101 | B2 | 10/2010 | Morikawa |
| 8,028,970 | B2 | 10/2011 | Fukano et al. |
| 8,294,304 | B1 | 10/2012 | Ledbetter et al. |
| 8,295,695 | B2 | 10/2012 | Yoshida et al. |
| 8,454,063 | B2 | 6/2013 | David et al. |
| 8,503,152 | B2 | 8/2013 | Feltz et al. |
| 8,941,417 | B2 | 1/2015 | Dornseifer et al. |
| 9,022,350 | B2 | 5/2015 | Jung |
| 9,183,976 | B2 | 11/2015 | Hanchett, Jr. et al. |
| 9,787,315 | B1 | 10/2017 | Watanabe et al. |
| 10,371,016 | B2 | 8/2019 | Mccarthy, Jr. et al. |
| 11,424,061 | B2 | 8/2022 | Shaffer |
| 2001/0032999 | A1 | 10/2001 | Yoshida |
| 2003/0016102 | A1 | 1/2003 | Hoepken |
| 2003/0053279 | A1 | 3/2003 | Meehleder et al. |
| 2003/0128555 | A1 | 7/2003 | Schemmann et al. |
| 2005/0180078 | A1 | 8/2005 | Sievers et al. |
| 2005/0194052 | A1 | 9/2005 | Gandrud |
| 2006/0221534 | A1 | 10/2006 | Oide |
| 2007/0120498 | A1 | 5/2007 | Caiafa et al. |
| 2008/0238391 | A1 | 10/2008 | Williams et al. |

| | | | |
|---|---|---|---|
| 2009/0237856 | A1 | 9/2009 | Ishitsuka et al. |
| 2009/0256534 | A1 | 10/2009 | Videtich et al. |
| 2010/0045053 | A1 | 2/2010 | Dye et al. |
| 2010/0082169 | A1 | 4/2010 | Crist et al. |
| 2010/0156314 | A1 | 6/2010 | Wang et al. |
| 2011/0241629 | A1 | 10/2011 | Jordan |
| 2013/0113579 | A1 | 5/2013 | Barnas et al. |
| 2013/0249537 | A1 | 9/2013 | Kahl et al. |
| 2014/0109479 | A1 | 4/2014 | Morstatt et al. |
| 2015/0359702 | A1 | 12/2015 | Rubin |
| 2016/0307683 | A1 * | 10/2016 | Davis ..................... E05B 47/02 |
| 2016/0310149 | A1 | 10/2016 | Downey |
| 2017/0193762 | A1 | 7/2017 | Warren et al. |
| 2017/0279287 | A1 * | 9/2017 | Solodovnik ............. B60L 58/20 |
| 2018/0075961 | A1 * | 3/2018 | Davis ................. E05B 47/0002 |
| 2018/0279566 | A1 | 10/2018 | Wlassich et al. |
| 2019/0267173 | A1 | 8/2019 | Shaffer et al. |
| 2019/0359702 | A1 | 11/2019 | Mann et al. |
| 2021/0012938 | A1 | 1/2021 | Dams |
| 2021/0219402 | A1 * | 7/2021 | Li ........................ H05B 45/345 |

FOREIGN PATENT DOCUMENTS

| | | | |
|---|---|---|---|
| CN | 204065891 | 12/2014 | |
| CN | 108631419 A | * 10/2018 | .............. H02J 50/12 |
| DE | 102008014976 | 11/2008 | |
| EP | 1437463 | 7/2004 | |
| FR | 2352381 | 12/1977 | |
| GB | 2479740 | 10/2011 | |
| GB | 2557973 | 7/2018 | |
| JP | 2006-302838 A2 | 11/2006 | |
| WO | 2005030528 | 4/2005 | |
| WO | 2014028332 | 2/2014 | |

OTHER PUBLICATIONS

Sun, Pinping, "Office Action", U.S. Appl. No. 16/406,464, filed May 8, 2019, dated Sep. 24, 2020.

Watt, John, "Combined Search and Examination Report under Sections 17 and 18(3)", UK Patent Application No. GB2006165.1 filed Apr. 27, 2020, dated Sep. 24, 2020.

Watt, John, "Combined Search and Examination Report under Sections 17 and 18(3)"; report dated Apr. 9, 2021 for Application No. GB2017818.2; UK Intellectual Patent Office, South Wales.

Watt, John, "Examination Report under Section 18(3)", UK Patent Application No. GB2006165.1 filed Apr. 27, 2020, dated Jul. 15, 2021.

Sun, Pinping, "Notice of Allowance", U.S. Appl. No. 17/078,134, filed Oct. 23, 2020, dated Apr. 20, 2022.

Martin, Tom "Examination Report under Section 18(3)", dated Jun. 28, 2022 for United Kingdom Application No. GB2006165.1, South Wales, United Kingdom, 3 pages.

Sun, Pinping, "Notice of Allowance", U.S. Appl. No. 16/406,464, filed May 8, 2019, dated Dec. 17, 2020.

Sun, Pinping, "Office Action", U.S. Appl. No. 17/078,134, filed Oct. 23, 2020, dated Dec. 1, 2021.

Howe, "How to Replace a Tailgate Lock Solenoid", pp. 1-3, 2016 (Year: 2016).

Sun, Pinping, "Non-Final Rejection", U.S. Appl. No. 17/078,135, filed Oct. 23, 2023, dated Dec. 24, 2021.

Sun, Pinping, "Final Rejection", U.S. Appl. No. 17/078,135, filed Oct. 23, 2023, dated May 11, 2022.

Sun, Pinping, "Notice of Allowance", U.S. Appl. No. 17/078,135, filed Oct. 23, 2023, dated Aug. 31, 2022.

* cited by examiner

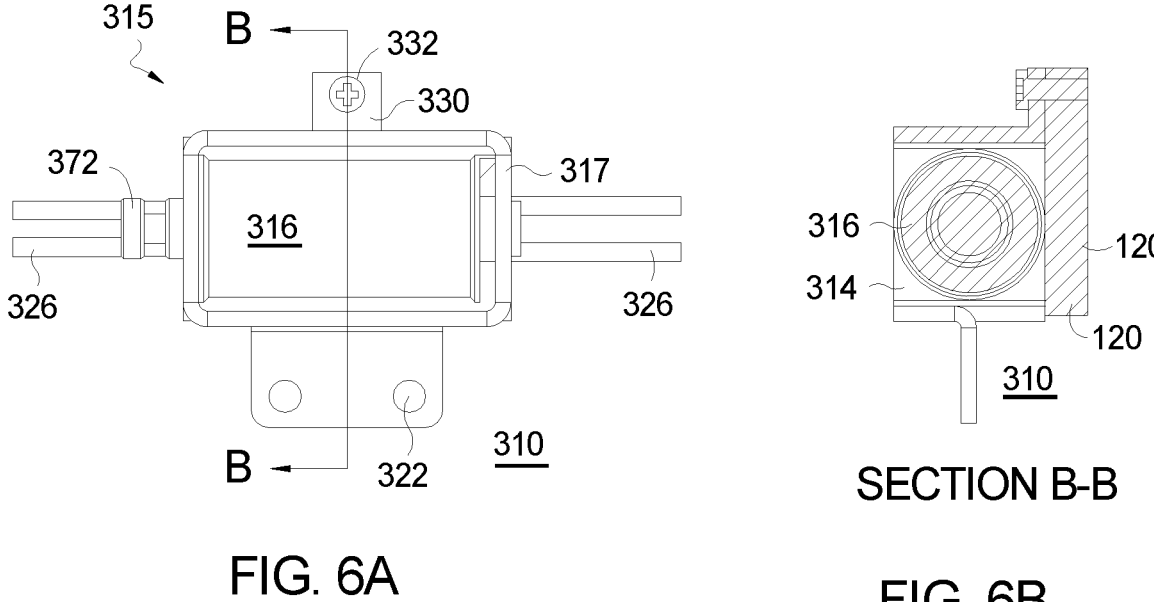
FIG. 6A
SECTION B-B
FIG. 6B
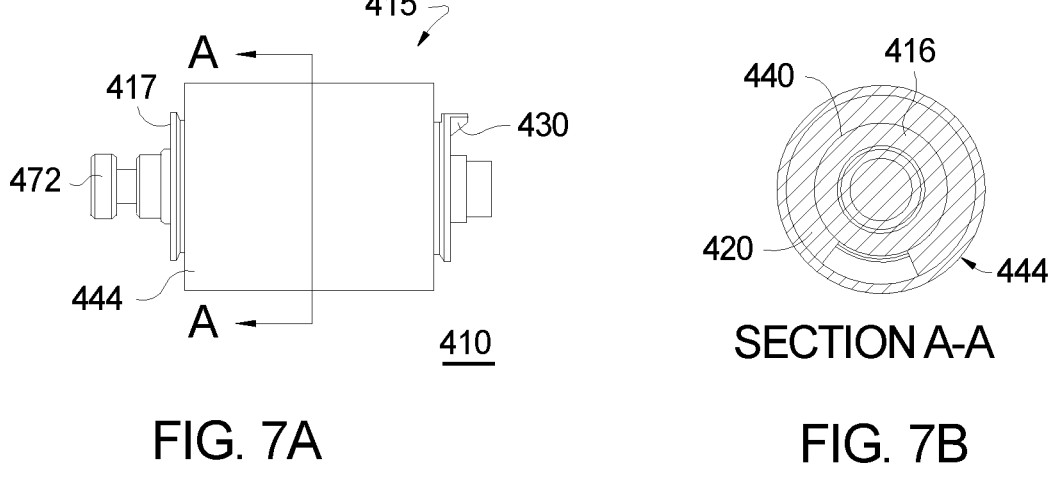
FIG. 7A
SECTION A-A
FIG. 7B

SOLENOID ASSEMBLY WITH INCLUDED CONSTANT-CURRENT CONTROLLER CIRCUIT

CROSS REFERENCE TO RELATED APPLICATIONS

This application is a continuation-in-part of U.S. patent application Ser. No. 17/078,135, filed Oct. 23, 2020, now U.S. Pat. No. 11,545,289, which is a divisional of U.S. patent application Ser. No. 16/406,464, filed May 8, 2019, now U.S. Pat. No. 10,964,467, which is a continuation-in-Part of U.S. patent application Ser. No. 15/098,522, filed Apr. 14, 2016, now U.S. Pat. No. 10,378,242, entitled CONSTANT-CURRENT CONTROLLER FOR INDUC-TIVE LOAD, which claims the benefit of U.S. Provisional Patent Application No. 62/147,478, filed Apr. 14, 2015, the contents of which are hereby incorporated by reference in their entirety.

TECHNICAL FIELD

The present invention relates to a constant-current controller for an inductive load such as a solenoid driver. Specifically, the invention relates to a constant-current controller circuitry contained on a Printed Circuit Board (PCB) that is integrated with and made a part of the solenoid driver of an electromechanical device. Because the constant-current circuitry can be packaged as part of the solenoid driver itself in accordance with the invention, upgrading an electromechanical device to the advantages of a constant-current controller is simplified, The electromechanical device may be an electronically actuated door latch mechanism.

BACKGROUND OF THE INVENTION

Solenoids are often used as the driver to operate many types of electromechanical devices, such as for example electromechanical door latches or strikes. In the use of solenoids as drivers in electromechanical door latches or strikes, when power is applied to the solenoid, the solenoid is powered away from the default state to bias a return spring. The solenoid will maintain the bias as long as power is supplied to the solenoid. Once power has been intentionally removed, or otherwise, such as through a power outage from the grid or as a result of a fire, the solenoid returns to its default position. Depending on the type latch or strike (fail-safe or fan-secure), the default position may place the latch in a locked (fail-secure) or unlocked (fail-safe) state. In a "fail-safe" system, as long as the latch or strike remains locked, power has to be supplied to the solenoid to maintain stored energy in the return spring. In a "fail-secure" system, the opposite is true.

The current to pull in the plunger of the solenoid against the return spring is referred to as the "pick" current and the current to hold the plunger against the return spring is referred to as the "hold" current. Typically, the pick current is much greater than the hold current regardless of whether the solenoid is used in a "fail-safe" or "fail-secure" system. Power provided to the solenoid of an electric latch or strike is most efficiently maintained if a constant current is provided to the inductive load.

In U.S. patent application Ser. No. 15/098,522 and assigned to Hanchett Entry Systems, Inc. (the "Parent Application"), a constant-current controller circuitry operable to supply a constant current to an inductive load is disclosed. The circuitry includes a switching circuit comprising a primary switch and a secondary switch. The switches are sequentially opened and closed as timed events whereby a periodic current to the solenoid becomes constant when a sufficiently large switching frequency is implemented. The controller may be operated as a pulse-width modulated controller. In one aspect of the circuit disclosed, the primary switch is a MOSFET.

Because of the size of the MOSFET, the PCB containing the MOSFET and supporting components is relatively large and substantially rigid, and therefore must be mounted remote from the solenoid and typically in the housing of the electric latch or strike remote. Thus, since the controller circuitry is made an integral part of the latch or strike itself when manufactured, retrofitting of an existing electromechanical door latch or strike with constant current controller circuitry is difficult and costly.

Therefore, there exists a need for a constant-current controller circuit to be integrated with an associated solenoid so that a constant current controlled solenoid may serve as a drop-in replacement for a standard solenoid of any solenoid-driven device.

SUMMARY OF THE INVENTION

What is presented is a constant-current control circuit situated on a printed circuit board (PCB) that is integrated with and made a part of a solenoid assembly used to drive an associated electromechanical device. The constant-current control circuit may comprise a switching circuit including a source voltage, a primary switch, and a secondary switch. The primary switch is connected with a coil of the solenoid assembly, wherein the primary switch is a gallium nitride field effect transistor (GaNFET) switch. The secondary switch is connected with the coil, wherein the coil has an inductance. The secondary switch may be a free-wheeling diode or a GaNFET switch. From $t_0$ to $t_{on}$, the primary GaNFET switch is closed and the secondary switch is open, the source voltage is applied across the coil, and a counter electromotive force (EMF) decays until the voltage across the coil equals the source voltage at $t_{on}$, thereby allowing current to flow through the coil. From $t_{on}$ to T, the primary GaNFET switch is open and the secondary switch is closed, and a positive EMF equal to the source voltage of the PCB is applied across the coil until the positive EMF decays to zero at T, such that the current continues to flow through the coil without the source voltage being applied across the coil.

In another aspect, a method for converting a first electrical strike without a constant-current control circuit to a second electrical strike with a constant-current control circuit is provided. The first electrical strike includes a first solenoid assembly comprising a first solenoid driver. The method comprises steps of: a) removing the first solenoid assembly from the first electrical strike; b) providing a second solenoid assembly comprising a plunger and a second solenoid driver having an integrated PCB, wherein the integrated PCB includes a switching circuit having a primary GaNFET switch and a secondary switch, wherein the primary GaNFET switch and the secondary switch are connectable to a coil of the second solenoid driver; c) replacing the removed first solenoid assembly with second solenoid assembly; and d) making the required feed wire connections to the second solenoid assembly to convert the first electrical strike without a constant-current control circuit to the second electrical strike having the constant-current control circuit, wherein the plunger of the second assembly is positioned to interact with actuating components of the second electrical strike.

In yet another aspect, a method for converting a first electrical latch without a constant-current control circuit to a second electrical latch with a constant-current control circuit is provided. The first electrical latch includes a first solenoid assembly comprising a first solenoid driver. The method comprising steps of: a) removing the first solenoid assembly from the first electrical latch; b) providing a second solenoid assembly comprising a plunger and a second solenoid driver having an integrated PCB, wherein the integrated PCB includes a switching circuit having a primary GaNFET switch and a secondary switch, wherein the primary GaNFET switch and the secondary switch are connectable to a coil of the second solenoid driver; c) replacing the removed the first solenoid assembly with second solenoid assembly; and d) making the required feed wire connections to the second solenoid assembly to convert the first electrical latch without a constant-current control circuit to the second electrical latch having the constant-current control circuit, wherein the plunger of the second assembly is positioned to interact with actuating components of the second electrical latch.

In a further aspect, an electromechanical device is provided which comprises an actuatable mechanical portion, a solenoid assembly, and one or more feedwire connections to the solenoid assembly. The solenoid assembly includes an integrated constant-current control circuit, wherein the solenoid assembly is used to drive the actuatable mechanical portion. The solenoid assembly comprises a solenoid driver including a coil and a printed circuit board (PCB) integrated with and made part of the solenoid assembly. The PCB is configured to provide a constant-current to the coil. The PCB includes a switching circuit comprising a source voltage, a primary GaNFET switch connected with the coil; and a secondary switch connected with the coil. The secondary switch may be a free-wheeling diode or a GaNFET switch. The PCB is formed into an arcuate shape, and is secured to a cylindrical outer surface of the solenoid driver and assumes a contour of the cylindrical surface.

In yet another aspect, a switching circuit is provided that provides an average current to an inductive load, wherein the inductive load is an electromagnetic door latch or strike having a coil. The switching circuit includes a total circuit resistance and further comprises a source voltage, a first switch connected in series with the coil, and a second switch connected in parallel with the coil wherein the coil has an inductance. From time($t_0$) to time($t_{on}$) when the first switch is closed and the second switch is open, and source voltage is applied across the coil, a counter EMF decays until the voltage across the coil equals the source voltage at $t_{on}$. From time($t_{on}$) to time(T), when the first switch is open and the second switch is closed, a positive EMF equal to the source voltage is applied across the coil until the positive EMF decays to zero at time(T). The average current is dependent upon the rate at which the first and second switches are opened and closed with respect to each other.

BRIEF DESCRIPTION OF THE DRAWINGS

The present invention will now be described, by way of example, with reference to the accompanying drawings, in which:

FIGS. 6A and 6B are views of a first embodiment of a solenoid assembly with integrated constant-current controller circuit in accordance with the invention; and FIGS. 7A and 7B are views of a second embodiment of a solenoid assembly with integrated constant-current controller circuit in accordance with the invention.

Corresponding reference characters indicate corresponding parts throughout the several views. The exemplifications set out herein illustrate currently preferred embodiments of the invention, and such exemplifications are not to be construed as limiting the scope of the invention in any manner.

DESCRIPTION OF THE PREFERRED EMBODIMENTS

Figure 1:
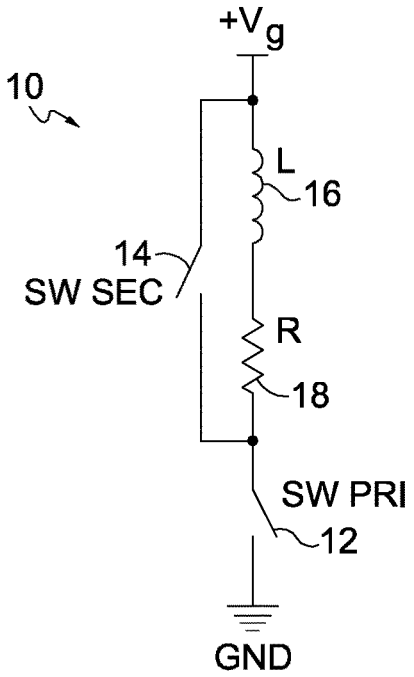
FIG. 1 is a functional schematic of a switching circuit, in accordance with an aspect of the present invention.

A functional schematic of the switching circuit 10 that produces constant current in an inductive load via switches controlled by pulse-width modulation (PWM) is shown in FIG. 1. There are two switches; a primary switch 12 and a secondary switch 14. When primary switch 12 is closed, the secondary switch 14 is open. When the primary switch 12 is open, the secondary switch 14 is closed. The series resistance (R), indicated in the circuit as resistor 18, is the sum of the coil resistance and the load resistance. Coil inductance and total circuit resistance comprise the inductive load.

When primary switch 12 is closed, source voltage ($V_s$) is applied across inductor ("coil") 16 and resistor 18. However since coil 16 opposes any change in current flow by producing a counter electromotive force (EMF) equal to the source voltage, current flow through coil 16 and resistor 18 is zero at the instant the primary switch 12 is closed, i.e., (to). Once primary switch 12 is closed, the counter EMF begins to decay until the voltage across coil 16 and resistor 18 equals the source voltage $V_s$, thereby allowing a current to flow through coil 16 and resistor 18. The time interval in which primary switch 12 is closed may be defined as $t_{on}$.

At the beginning of the time interval when secondary switch 14 is closed and primary switch 12 is opened (i.e. from $t_{on}$ until the end of the cycle (T)), there is no longer a source voltage Vs across coil 16. Once again, coil 16 opposes the change in current flow by producing a positive EMF equal to the source voltage Vs in the direction that was the source voltage's direction. Therefore, current continues to flow through coil 16 and resistor 18 without source voltage Vs being applied. From $t_{on}$ to the end of the cycle T, current through and voltage across coil 16 and resistor 18 decays to zero via the EMF discharged by coil 16. As such, the current in the inductive load is dependent upon the circuit parameters and the rate at which the switches 12 and 14 are opened and closed with respect to each other. This rate is the PWM frequency (f).

From the above discussion, it can be understood that current flow may be held constant by increasing the frequency in which the switches 12 and 14 are opened and closed. If the primary switch 12 is closed before the current decays to zero, the initial current becomes the boundary current. The load current is equal to the boundary current at the beginning and end of each period T. Non-zero boundary current increases the average value of the load current. As the period T is decreased substantially less than the L/R time constant, wherein L/R is the ratio of coil inductance to circuit resistance, the current may be held to any value between 0 and Vs/R by varying the duty ratio of primary switch 12, where the duty ratio is defined by $t_{on}$/T. This constant current control is especially useful since, in the example of a magnetic lock or solenoid driver, power to the lock can be precisely controlled by varying the duty ratio (i.e., power can be increased to resist an instantaneous and unwanted attempt to open the door yet be reduced while the door is at idle). That is, for a sufficiently high frequency, the current is constant and can be maintained by a PWM controller so as to be any value between 0 and $V_s$/R.

Figure 2:
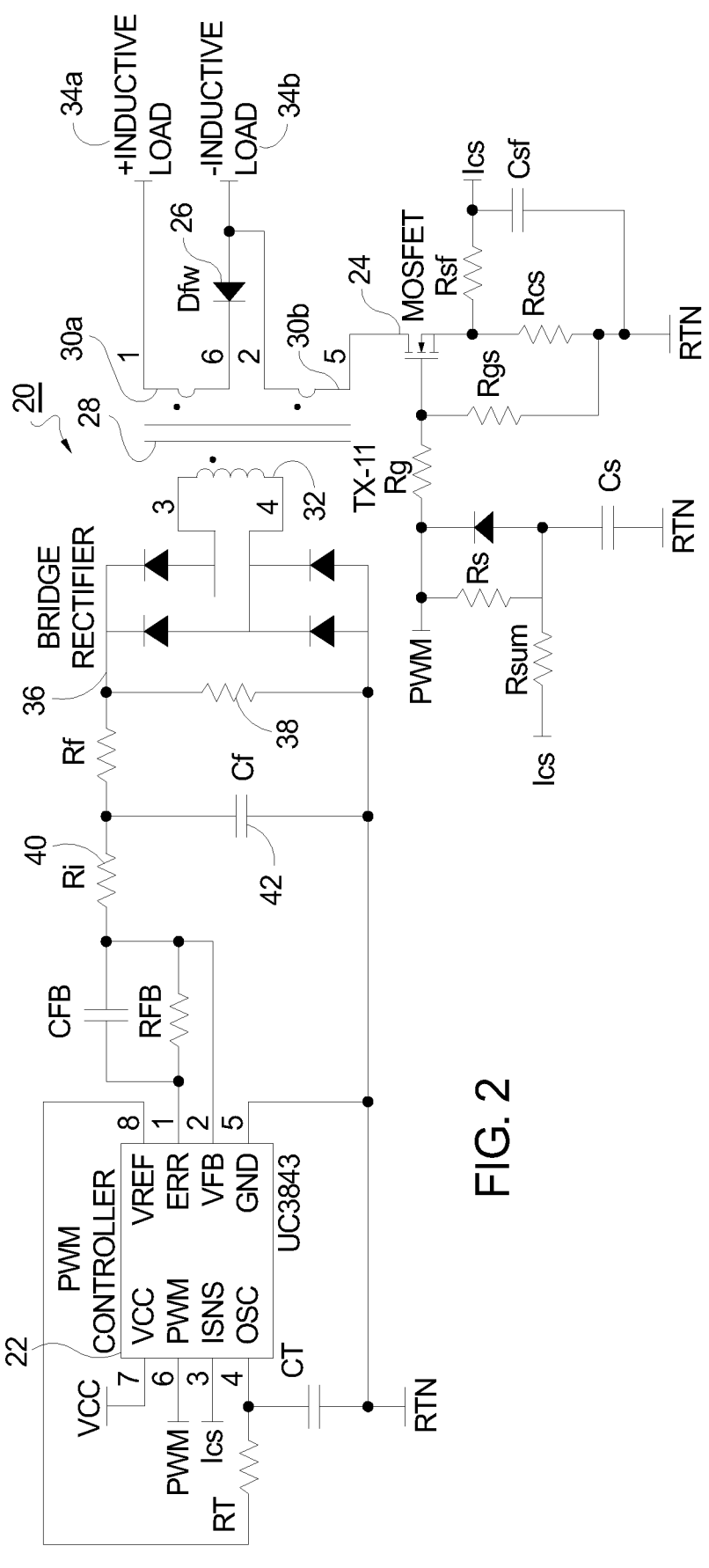
FIG. 2 is a schematic of an embodiment of a constant current PWM controller circuit, in accordance with an aspect of the present invention.
Figure 2A:
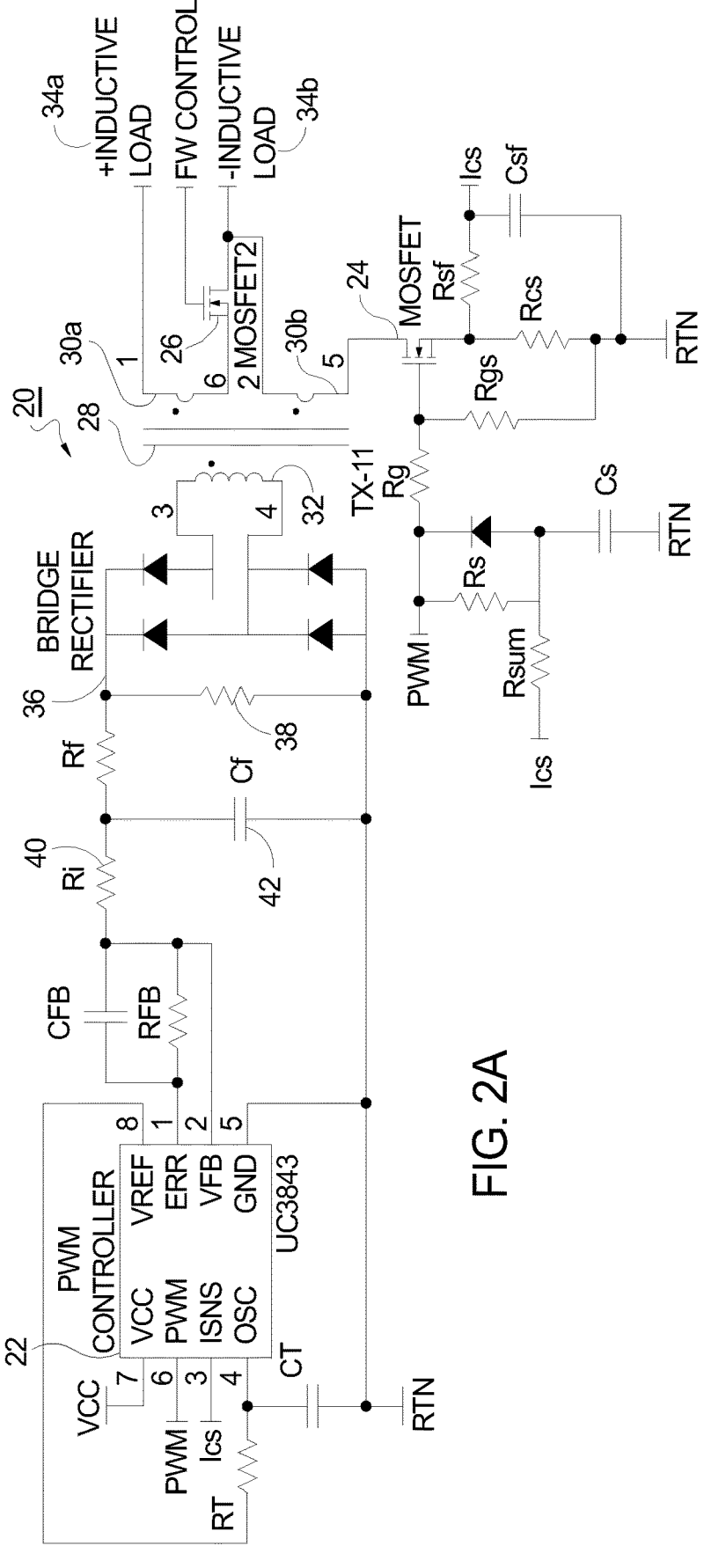
FIG. 2A is a schematic similar to FIG. 2 wherein a secondary switch is a GaNFET switch.

Further in regard to the disclosure made in the Parent Application, FIG. 2 depicts a constant-current controller circuit that may be used in conjunction with an electric latch or strike. It has been found that power to an access control device having inductive load actuator, such as but not necessarily limited to either a magnetic lock or a solenoid driver, is most efficiently provided if a constant current is provided to the inductive load actuator. An exemplary circuit 20 for a constant-current PWM controller 22 is shown in FIG. 2. The circuit makes use of a PWM controller integrated circuit 22 with current sensing used as the feedback mechanism. The primary switch 24 is typically a MOSFET (analogous to primary switch 12 described above) while the secondary switch 26 (i.e. switch 14) is typically a free-wheeling diode (shown as "Dfw"). The secondary switch may also be a Gallium Nitride FET (GaNFET) switch as seen in FIG. 2A.

A current transformer 28 with two single-turn primary windings 30a and 30b and one secondary winding 32 with N-turns is used to sense the two components of the load current 34a and 34b. Primary windings 30a and 30b are connected in series with switches 24 and 26, respectively. Secondary winding 32 is connected to a bridge rectifier 36, burden resistor ($R_B$) 38, and low-pass filter resistor ($R_f$) 40 and capacitor ($C_f$) 42. It should be noted that any component having an equivalent functionality to the current transformer 28 may be installed within circuit 20. For example, a skilled artisan will see that the current transformer 28 may be replaced with Hall-effect sensors specified to have similar functionality.

When primary switch 12 is on (MOSFET 24 in FIG. 2), the first current component flows through the primary winding at Terminals 3 and 4. This component is transformed to the secondary winding 32 as:

$$i_s = \frac{DV_s}{NR}, 0 \le t \le t_{on}$$

When primary switch 24 turns off, the coil current continues to flow, due to the stored energy, but is now diverted into the free-wheeling diode 26 (i.e. secondary switch 14). This second current component now flows through the primary winding at Terminals 1 and 2. Due to the arranged phasing of the current transformer 28, the second current component is transformed to the secondary winding 32 as:

$$i_s = -\frac{DV_s}{NR}, t_{on} \le t \le T$$

The secondary currents are rectified through bridge rectifier 36 to produce a constant current through the burden resistor 38:

$$i_B = \frac{DV_s}{NR}, 0 \le t \le T$$

The value of the burden resistor is calculated to produce a voltage that is equal to the internal voltage reference, $V_r$, of the integrated circuit:

$$R_B = \frac{NR^{V_r}}{DV_s}$$

Thus, the value of burden resistance 38 establishes the feedback voltage to the PWM controller 22 at $V_r$. At this voltage, PWM controller 22 regulates the current through the inductive load to maintain the feedback voltage at this operating point. Thus, the value of $R_B$ establishes the value of the constant current through the inductive load.

Figure 3:
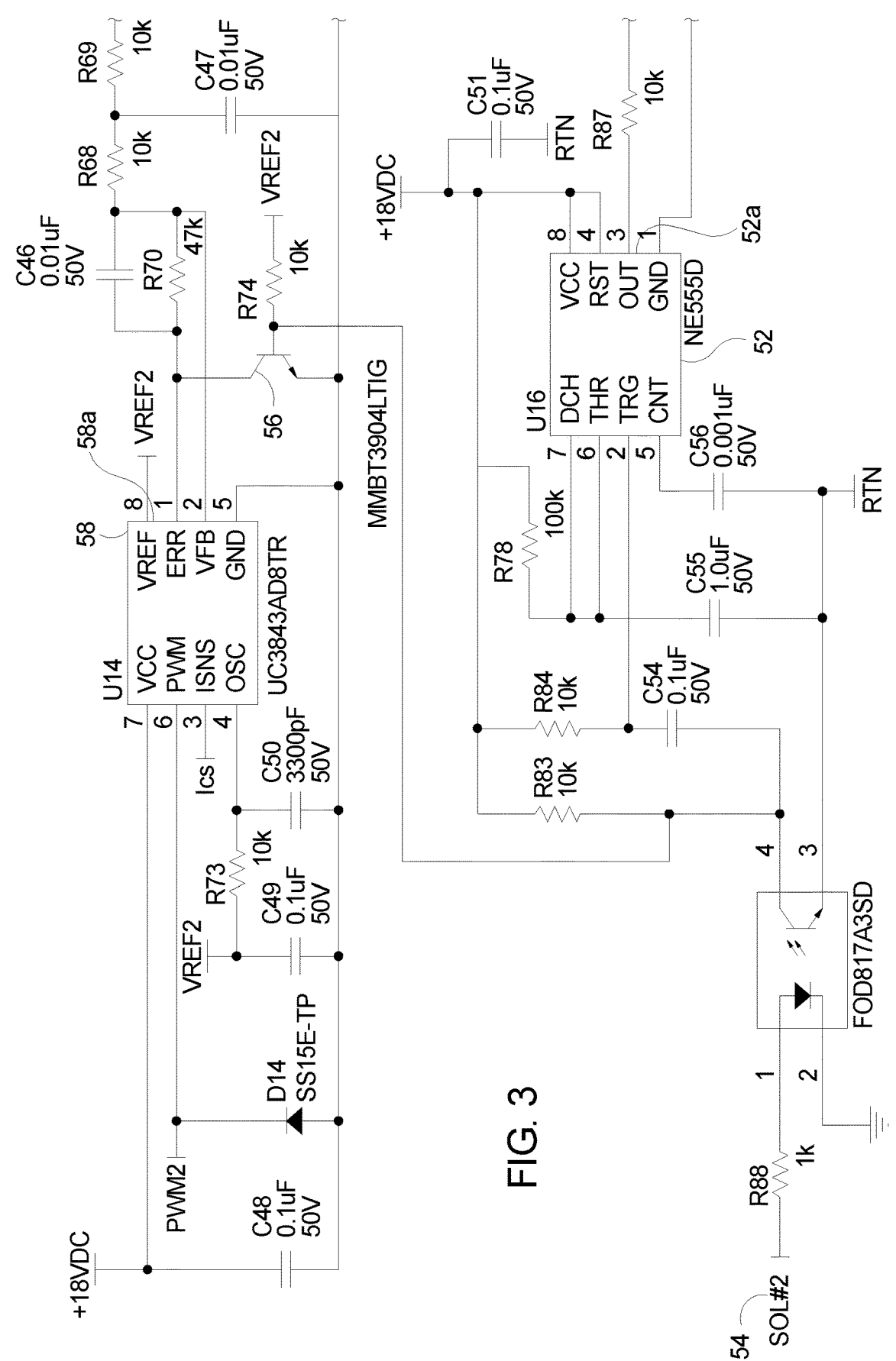
FIG. 3 is a schematic of another embodiment of a constant current PWM controller circuit configured for pick and hold states, in accordance with a further aspect of the present invention.
Figure 3:
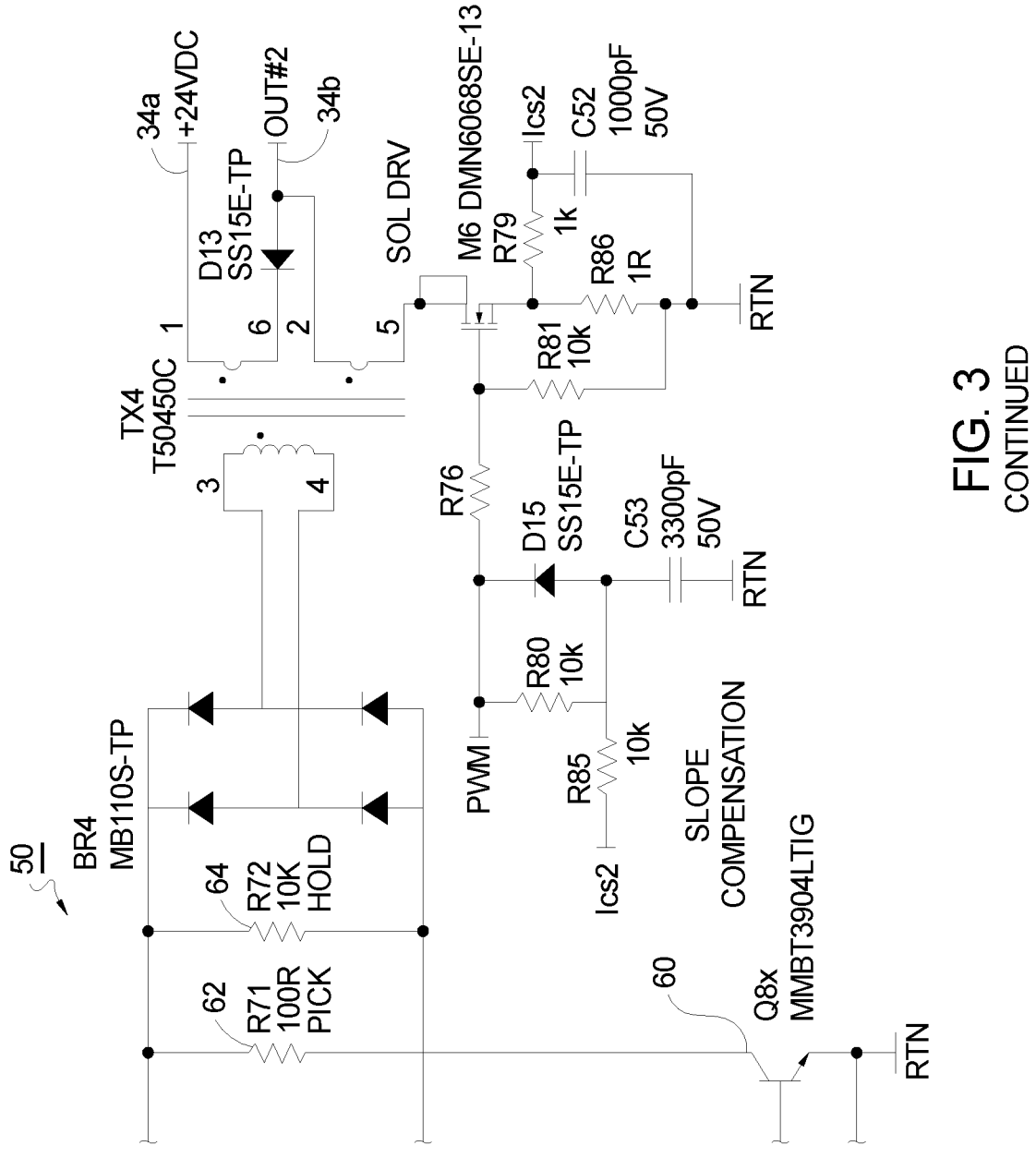

Still further in regard to the disclosure made in the Parent Application, FIG. 3 shows another exemplary circuit schematic 50 that may be suitable for use in conjunction with an electric latch or strike which employs a solenoid. As is recognized in the art, solenoid-driven actuators have long been known for their power inefficiencies. Since their pull-in current (pick current) is higher than the current needed to hold the solenoid plunger in place (hold current), to save energy, it is desirable for the controller to step down the current after the fixed duration of time during which the pick current has been applied.

To improve energy efficiencies, circuit 50 may use a combination of individual resistors in parallel to produce a collective burden resistor that may be used to change the operating current in the solenoid. In the case of a solenoid, two operating points are required, with the first being the pull-in or pick current. This relatively large current is sourced into the solenoid coil for a short time interval to engage the solenoid. Once the solenoid has been actuated, the pick current is followed by a much smaller holding or hold current to maintain the position of the solenoid plunger. In accordance with an aspect of the present invention, this pick and hold operation may be accomplished using a constant current controller by changing the value of the burden resistor once the solenoid has engaged, as will be discussed in greater detail below.

In reference to FIG. 3, circuit 50 makes use of a timer integrated circuit 52 to establish the time interval of the pull-in operation. The timer receives a signal through input 54 that initiates the pull-in interval. With no signal applied, transistor 56 (Q7) is on, Pin 1 (58a) of PWM controller 58 (U14) is pulled to ground such that PWM controller 58 is disabled. As a result, no current flows through the solenoid coil connected at terminals 34a (+24VDC) and 34b (OUT#2).

When input 54 is switched to logic-level HIGH, PWM controller 58 is enabled and the pick interval starts with a logic-level HIGH at the OUT pin (52a) of timer integrated circuit 52. This output turns on transistor 60 (Q8) and connects resistor 62 (R71) and resistor 64 (R72) in parallel. This combined resistance value establishes the value of the pull-in current. Once the pull-in interval has expired, OUT pin 52a returns to a logic-level LOW, transistor 60 (Q8) turns off, and resistor 62 (R71) is disconnected from the circuit. Resistor 64 (R72) remains as the burden resistance and establishes the hold current of the solenoid. By way of example, if resistor 62 has a resistance of 100 ohms and resistor 64 has a resistance of 10,000 ohms and 24 V is being supplied, the pick current will be about 0.24 A (24 V/99 ohms=0.24 A) while the hold current will be about 2.4 mA (24 V/10,000 ohms=0.0024 A). In this manner, power efficiencies may be realized as high current is applied only for a set, limited period of time before the circuit switches to provide the less-demanding hold current. The above discussion with reference to FIGS. 1-3 was disclosed in the co-pending Parent Application.

A PCB, as known in the art, is a modular platform of electronic components that are interconnected to form a circuit. The structural base or substrate of the PCB is formed of an insulating material. The circuit itself is formed by a thin layer of conducting material deposited in a pattern on the insulating base. The necessary electronic components making up the desired circuitry are then placed on the surface of the insulating material and soldered to the deposited conducting material. Thus the overall size of the PCB is substantially dependent upon the types of electronic components needed to form the circuitry and the physical sizes of the electronic components. Further, while the PCB substrate may be approximately 1.5 mm thick and itself flexible, depending on the number of electronic components soldered to the substrate and their physical sizes, the resulting PCB may be rendered relatively rigid and inflexible.

The footprint of MOSFET 24 as disclosed in the Parent Application measures approximately 4.0 mm×5.0 mm and therefore requires a relatively large PCB to contain it and its supporting components. The thickness of MOSFET 24 is approximately 1.75 mm. As a result of these physical attributes of MOSFET 24, and the layout and construction of the necessary supporting electronic components, the size of its PCB becomes relatively large, measuring approximately 30.0 mm×40.0 mm, and is also rendered rigid and inflexible. Consequently, a dedicated space must be provided remote from the electromechanical device for mounting such a large PCB, making a retrofit of the constant-current controller circuit as disclosed in the Parent Application difficult and impractical.

The use of a Gallium Nitride FET (GaNFET) manufactured by Efficient Power Conversion Co. of El Segundo, CA 90245 (part no. EPC2039) as a primary switch in place of MOSFET 24 solves the problem. The physical size of a GaNFET is much smaller than a MOSFET. Therefore, the size of the PCB needed to support the GaNFET is much smaller. Thus, the smaller physical size of a GaNFET/PCB will enable the PCB to be mounted directly on an associated solenoid driver.

Figure 4:
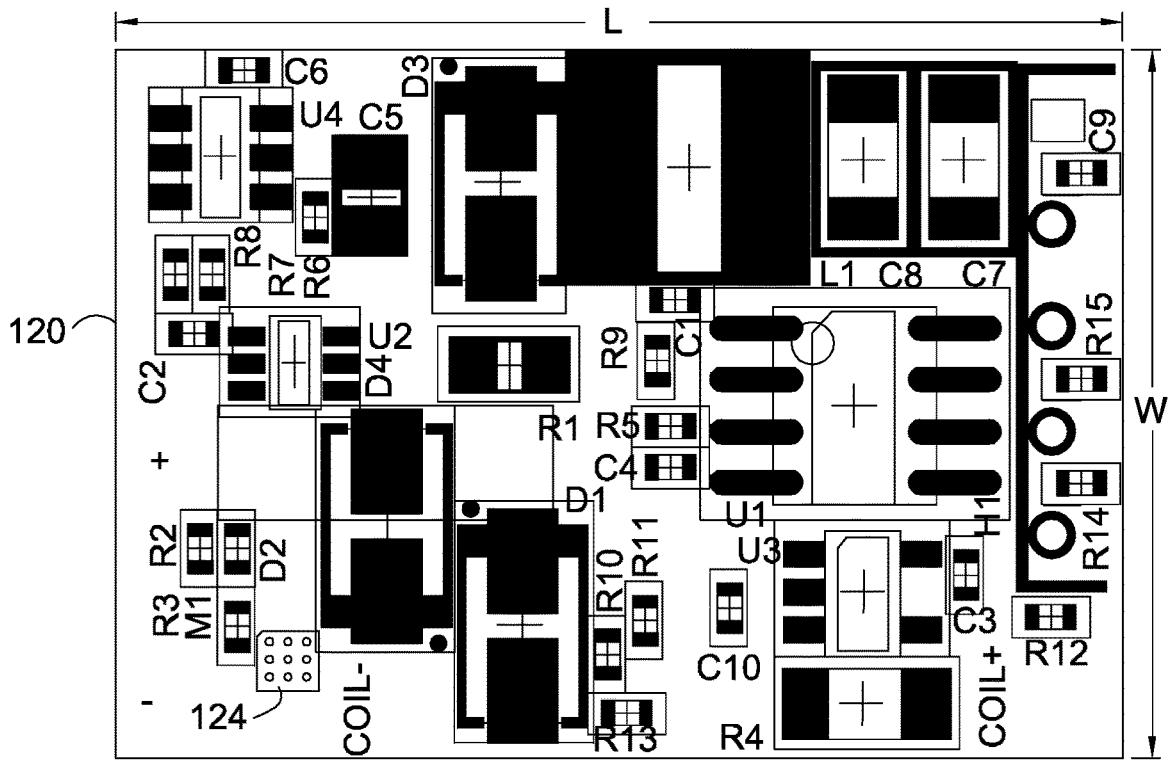
FIG. 4 is a generalized schematic of a PCB containing a GaFNET and its supporting electronic components in accordance with the invention.

Referring to FIG. 4, a magnified view of much smaller PCB 120 of a constant-current control circuit containing GaNFET 124 and its supporting electronic components is shown. The footprint of GaNFET 124 measures approximately 1.35 mm×1.35 mm and is much less than the footprint of MOSFET 24. Its thickness is also less than the thickness of MOSFET 24, measuring approximately 0.625 mm. The result is that a much smaller PCB 120 may be utilized, having a length (L) of approximately 24.1 mm and a width (W) of approximately 17.5 mm. Moreover, PCB 120 is rendered flexible via the use of GaNFET 124.

The use of GaNFET 124 as the primary switch in the circuit enables PCB 120 to be located within the framework of the associated electromechanical device and integrated with the associated solenoid driver itself, making the circuit of a prior art electromechanical devise easily upgraded to a constant-current controller circuit. The upgrade may be accomplished for the most part by a simple replacement of the solenoid driver.

Figures 5, 5A:
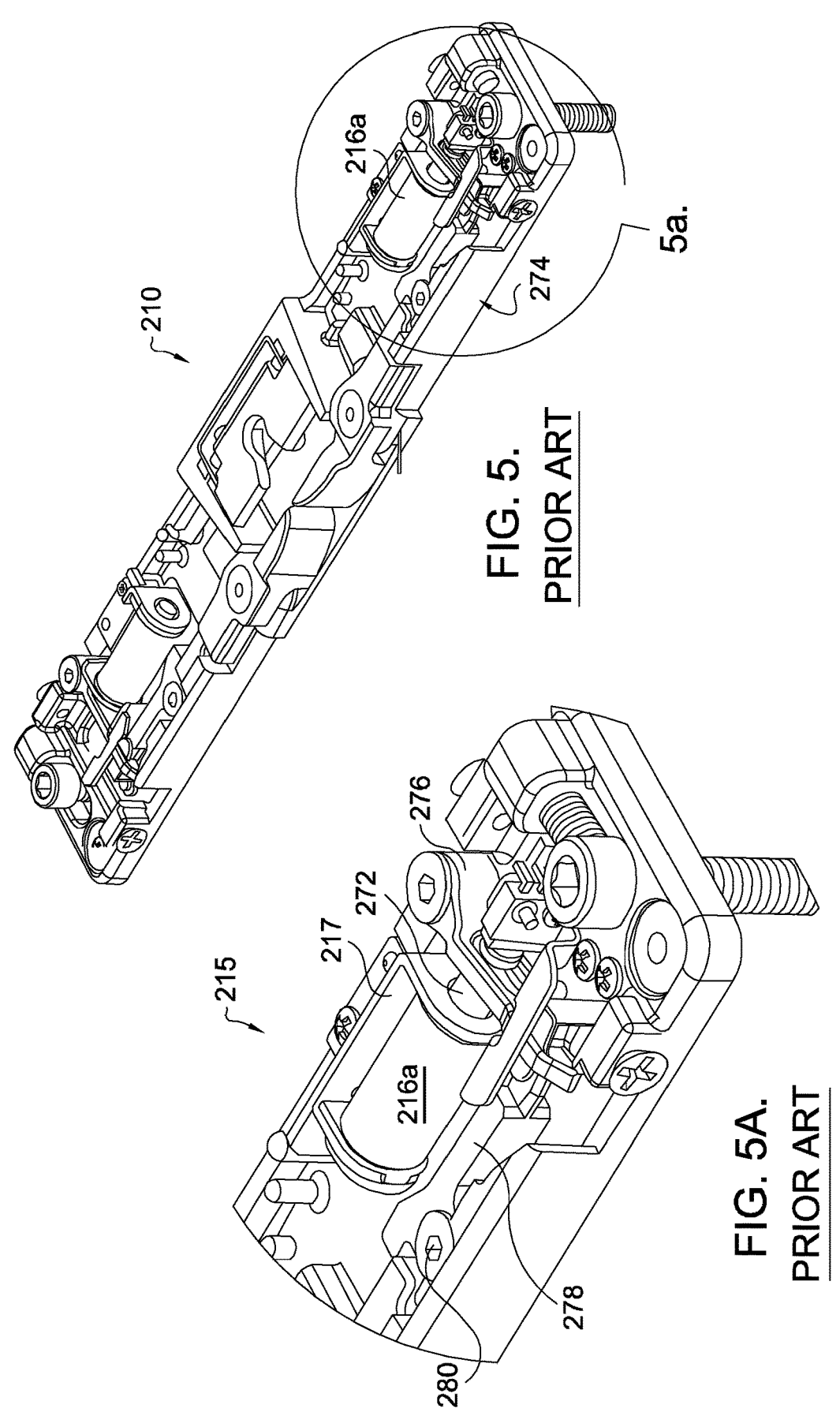
FIGS. 5 and 5A are views of a prior art electric strike assembly.

FIGS. 5 and 5A shows an example of a prior art electric strike assembly 210 as disclosed in U.S. Pat. No. 8,454,063. Electric strike assembly 210 utilizes two solenoid assemblies 215 and two solenoid drivers 216a to control release of keeper(s) 270 to their unlocked state. Each solenoid assembly includes solenoid driver 216a and solenoid bracket 217.

With reference to FIG. 5A depicting only one side of electric strike assembly 210, when solenoid driver 216a is energized and solenoid plunger 272 extends, actuating components 274 interact with each other to permit keeper 270 to move to its unlocked state. In the example of an electric strike assembly shown, upon extension of plunger 272, release lever 276 rotates, allowing transmission lever 278 to rotate about pivot 280 which in turn releases keeper 270 for movement to its unlocked state. Solenoid assembly 215, solenoid driver 216a and actuating components 274 are located within housing 282 of electric strike assembly 210.

Power for energizing solenoid driver 216a is provided by a switch (not shown) located remote from the strike assembly 210; a feed wire (not shown) connects the switch to solenoid driver 216a. In the example shown, the switch may be a button switch, a keypad, a swipe card, or the like. If strike assembly 210 were to be configured with constant-current circuits 20 or 50, because of its size, the PCB (with included MOSFET 24) would have to be mounted somewhere remote from electric strike assembly 210 making conversion of strike assembly 210 to constant-current circuit configuration difficult.

Referring to FIGS. 6A and 6B, in accordance with the invention, solenoid assembly 315, including integrated constant-current control circuit is shown. Solenoid assembly 315 includes solenoid bracket 317, solenoid driver 316 and generally planar PCB 120. Cavity 314 of bracket 317 is sized to receive solenoid driver 316. When solenoid driver 316 is energized, plunger 372 of solenoid driver 116 interacts with actuating components (not shown) of associated electromechanical device 310 such as an electrical latch or strike, thereby placing the latch or strike in its locked or unlocked state as known in the art. Flange 330 may extend outward from housing and includes mounting holes 322 for mounting solenoid assembly 315 to the associated electromechanical device 310 with appropriate fasteners (not shown). With the reduced footprint of GaNFET 124, PCB 120 may be attached with fastener 332 to solenoid driver 316 and made part of solenoid assembly 315. Feed wires 326 provide electrical connectivity to PCB 120 and to solenoid driver 316, as needed.

Thus, an electromechanical device 210 without a constant-current control circuit may be readily converted to one with a constant-current control circuit by:

a) providing a first electromechanical device 210 without a constant-current control circuit, wherein the first electromechanical device 210 includes a first solenoid assembly 215 comprising a solenoid driver 216a;

b) removing the first solenoid assembly 215;

c) providing a second solenoid assembly 315 comprising a solenoid driver 316 and PCB 120;

d) replacing the removed first solenoid assembly 215 with second solenoid assembly 315; and e) making the required feed wire connections to convert the first electromechanical device 210 to a second electromechanical device 310 having said constant-current control circuit.

Referring to FIGS. 7A and 7B, an alternate embodiment of a solenoid assembly 415 with an integrated constant-current controller circuit is shown. Solenoid assembly 415 includes solenoid mounting bracket 417 and solenoid driver 416. When solenoid driver 416 is energized, plunger 472 of solenoid driver 416 interacts with components (not shown) of the electromechanical device shown schematically as 410. In the case of an electrical latch or strike, such interaction places the associated latch or strike in its locked or unlocked state as known in the art. Tab 430 may extend from mounting bracket 417 for mounting solenoid assembly 415 to the associated electromechanical device by appropriate means as known in the art. With the reduction in size of GaNFET 124, PCB 420 may be flexed into an arcuate shape as shown, assuming the general contour of the outer cylindrical surface of solenoid driver 416. The length (L) and circumference (C) of solenoid driver 416 are sized to accommodate the width (17.53 mm) and length (24.13 mm) of PCB 420, when flexed. As shown in FIG. 7B, flexed PCB 420 may be bonded to the cylindrical surface 440 of solenoid driver 416 as known in the art. A wrap 444 may then by placed over flexed PCB 420 for protection. Feed wires (not shown) provide electrical connectivity to PCB 420 and to solenoid driver 416, as needed. With respect to the embodiment shown in FIGS. 7A and 7B, an electromechanical device 210 without a constant-current control circuit may be readily converted to one with a constant-current controller circuit by:

a) providing a first electromechanical device 210 without a constant-current controller circuit wherein the first electromechanical device 210 includes a first solenoid assembly 215 comprising a solenoid driver 216*a*;

b) removing the first solenoid assembly 215;

c) providing a second solenoid assembly 415 comprising a solenoid driver 416 and integrated PCB 420;

d) replacing the removed first solenoid assembly 215 with said second solenoid assembly 415; and e) making the required feed wire connections to convert the first electromechanical device 210 to a second electromechanical device 410 having the constant-current controller circuit.

Thus, solenoid assemblies 315 and 415 may be built into an "as-manufactured" electromechanical device or serve as a "drop-in" replacement for a standard solenoid used in an existing electromechanical device thereby converting the standard circuit to a constant-current control circuit so as to provide the increased efficiency and power savings enjoyed by the circuit disclosed in the Parent Application.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

What is claimed is:

1. A constant-current control circuit situated on a printed circuit board (PCB) that is integrated with and made a part of an actuator assembly used to drive an associated electromechanical device, said constant-current control circuit comprising:

a switching circuit including:
a source voltage;
a primary switch connected with a coil of said actuator assembly, wherein said primary switch is a gallium nitride field effect transistor (GaNFET) switch; and a secondary switch connected with said coil, wherein said coil has an inductance, wherein, from $t_0$ to $t_{on}$, said GaNFET primary switch is closed and said secondary switch is open, said source voltage is applied across said coil, and a counter electromotive force (EMF) decays until the voltage across said coil equals said source voltage at $t_{on}$, thereby allowing a current to flow through said coil, and wherein, from $t_{on}$ to T, said GaNFET primary switch is open and said secondary switch is closed, and a positive EMF equal to said source voltage of said PCB is applied across said coil until said positive EMF decays to zero at T, such that said current continues to flow through said coil without said source voltage being applied across said coil, wherein said GaNFET primary switch has a width and a length of approximately 1.35 mm and a thickness of approximately 0.625 mm, and said PCB is rendered flexible via integration of said GaNFET primary switch.

2. The constant-current control circuit according to claim 1, further comprising:

a pulse-width modulation (PWM) controller configured to cause a periodic current in said coil to become constant by increasing a PWM switching frequency to a threshold frequency having a switching period that is less than a circuit time constant, wherein a boundary current and a peak current approach the same constant value as said PWM switching frequency increases.

3. A constant-current control circuit situated on a printed circuit board (PCB) that is integrated with and made a part of an actuator assembly used to drive an associated electromechanical device, said constant-current control circuit comprising:

a switching circuit including:
a source voltage;
a primary switch connected with a coil of said actuator assembly, wherein said primary switch is a gallium nitride field effect transistor (GaNFET) switch; and
a secondary switch connected with said coil, wherein said coil has an inductance, a pulse-width modulation (PWM) controller configured to cause a periodic current in said coil to become constant by increasing a PWM switching frequency to a threshold frequency having a switching period that is less than a circuit time constant, wherein a boundary current and a peak current approach the same constant value as said PWM switching frequency increases, wherein, from $t_0$ to $t_{on}$, said GaNFET primary switch is closed and said secondary switch is open, said source voltage is applied across said coil, and a counter electromotive force (EMF) decays until the voltage across said coil equals said source voltage at $t_{on}$, thereby allowing current to flow through said coil, and wherein, from $t_{on}$ to T, said GaNFET primary switch is open and said secondary switch is closed, and a positive EMF equal to said source voltage of said PCB is applied across said coil until said positive EMF decays to zero at T, such that said current continues to flow through said coil without said source voltage being applied across said coil, wherein an average current in said coil is dependent upon a rate at which said GaNFET primary switch and said secondary switch are opened and closed with respect to each other, and wherein the rate is the PWM switching frequency.

4. The constant-current control circuit according to claim 3, wherein said PWM controller is configured to adjust a duty ratio of said GaNFET primary switch to maintain said constant current flow.

5. The constant-current control circuit according to claim 3, wherein said PWM controller is configured to hold said current flow constant by increasing the rate at which said GaNFET primary switch and said secondary switch are opened and closed with respect to each other, and wherein the rate is the PWM switching frequency.

6. The constant-current control circuit according to claim 1, wherein said actuator assembly comprises a solenoid including a solenoid driver including said coil, and a solenoid bracket for connecting said solenoid assembly to said associated electromechanical device, wherein a cavity of said solenoid bracket is sized to receive said solenoid driver, and said PCB is generally planar and mounted directly on said solenoid driver, wherein said PCB is secured to said solenoid driver with a fastener or screw.

7. A constant-current control circuit situated on a printed circuit board (PCB) that is integrated with and made a part of an actuator assembly used to drive an associated electromechanical device, said constant-current control circuit comprising:

a switching circuit including:

a source voltage;

a primary switch connected with a coil of said actuator assembly, wherein said primary switch is a gallium nitride field effect transistor (GaNFET) switch; and a secondary switch connected with said coil, wherein said coil has an inductance, wherein, from $t_0$ to $t_{on}$, said GaNFET primary switch is closed and said secondary switch is open, said source voltage is applied across said coil, and a counter electromotive force (EMF) decays until the boltage across said coil equals said source voltage at $t_{on}$, thereby allowing current to flow through said coil, and wherein, from $t_{on}$ to T, said GaNFET primary switch is open and said secondary switch is closed, and a positive EMF equal to said source voltage of said PCB is applied across said coil until said positive EMF decays to zero at T, such that said current continues to flow through said coil without source voltage being applied across said coil, wherein said GaNFET primary switch has a width and a length of approximately 1.35 mm and a thickness of approximately 0.625 mm.

8. The constant-current control circuit according to claim 7, wherein said actuator assembly includes a solenoid driver including said coil, and a mounting bracket for mounting said actuator assembly to said associated electromechanical device, and said PCB is flexed into an arcuate shape assuming a general contour of a cylindrical outer surface of said solenoid driver.

9. The constant-current control circuit according to claim 8, further comprising a protective wrap over said flexed PCB and wherein:

a length (L) and a circumference (C) of said cylindrical outer surface of said solenoid driver are sized to accommodate a width of approximately 17.5 mm and a length of approximately 24.1 mm of said PCB, when flexed, and said flexed PCB is bonded to said cylindrical outer surface of said solenoid driver.

10. The constant-current control circuit according to claim 1, wherein said secondary switch is a free-wheeling diode or a GaNFET switch.

11. The constant-current control circuit according to claim 1, wherein said associated electromechanical device is an electromechanical door latch or an electromechanical strike.

12. The constant-current control circuit according to claim 11, wherein said control circuit controls power to said electromechanical door latch or said electromechanical strike by adjusting a duty ratio of said GaNFET primary switch.

13. A constant-current control circuit situated on a printed circuit board (PCB) that is integrated with and made a part of an actuator assembly used to drive an associated electromechanical device, said constant-current control circuit comprising:

a switching circuit including:

a source voltage;

a primary switch connected with a coil of said actuator assembly, wherein said primary switch is a gallium nitride field effect transistor (GaNFET) switch; and a secondary switch connected with said coil, wherein said coil has an inductance, wherein, from $t_0$ to $t_{on}$, said GaNFET primary switch is closed and said secondary switch is open, said source voltage is applied across said coil, and a counter electromotive force (EMF) decays until the voltage across said coil equals said source voltage at $t_{on}$, thereby allowing current to flow through said coil, wherein, from $t_{on}$ to T, said GaNFET primary switch is open and said secondary switch is closed, and a positive EMF equal to said source voltage of said PCB is applied across said coil until said positive EMF decays to zero at T, such that said current continues to flow through said coil without said source voltage being applied across said coil, wherein said control circuit is configured to maintain said constant current flow by increasing a PWM switching frequency at which said GaNFET primary switch and said secondary switch are opened and closed with respect to each other, and wherein said associated electromechanical device is an electromechanical door latch or an electromechanical strike, and wherein said control circuit controls power to said electromechanical door latch or said electromechanical strike by adjusting a duty ratio of said GaNFET primary switch.

14. A constant-current control circuit situated on a printed circuit board (PCB) that is integrated with and made a part of an actuator assembly used to drive an associated electromechanical device, said constant-current control circuit comprising:

a switching circuit including:

a source voltage;

a primary switch connected with a coil of said actuator assembly, wherein said primary switch is a gallium nitride field effect transistor (GaNFET) switch; and a secondary switch connected with said coil, wherein said coil has an inductance; and a pulse-width modulation (PWM) controller for generating signals to synchronously alternate on-times and off-times of the GaNFET primary switch and the secondary switch, respectively, and wherein said control circuit controls power to said electromechanical door latch or said electromechanical strike by adjusting a duty ratio of said GaNFET primary switch and said secondary switch, wherein, from $t_0$ to $t_{on}$, said GaNFET primary switch is closed and said secondary switch is open, said source voltage is applied across said coil, and a counter electromotive force (EMF) decays until the voltage across said coil equals said source voltage at $t_{on}$, thereby allowing current to flow through said coil, and wherein, from $t_{on}$ to T, said GaNFET primary switch is open and said secondary switch is closed, and a positive EMF equal to said source voltage of said PCB is applied across said coil until said positive EMF decays to zero at T, such that said current continues to flow through said coil without said source voltage being applied across said coil, wherein said associated electromechanical device is an electromechanical door latch or an electromechanical strike.

\* \* \* \* \*